Sept. 15, 1970 F. N. KING 3,529,266

CONTINUOUSLY AND DYNAMICALLY VARIABLE PIN DIODE ATTENUATOR

Filed Aug. 12, 1968

Fred N. King,
INVENTOR.

Harry M. Saragovitz
Edward J. Kelly
Herbert Berl
BY 3,529,266

CONTINUOUSLY AND DYNAMICALLY VARIABLE PIN DIODE ATTENUATOR

Fred N. King, Rockville, Md., assignor, by mesne assignments, to the United States of America as represented by the Secretary of the Army Filed Aug. 12, 1968, Ser. No. 752,061
Int. Cl. H01p *1/22*; H03h *7/24*
U.S. Cl. 333—81 8 Claims

ABSTRACT OF THE DISCLOSURE

PIN diodes are connected in various series and parallel configurations with resistors to provide an attenuator for nanosecond pulses. Advantage is taken of the variable resistance characteristics of PIN diodes to provide an attenuator whose input and output impedances remain constant while the attenuation varies.

SUMMARY OF THE INVENTION

The present invention is an attenuator in which the input and output impedances are held constant while the attenuation is varied. PIN diodes are inserted in series or in parallel with the resistors of the attenuator. As the bias currents of the diodes change, so does the attenuation, yet the net input and output impedances remain constant.

DESCRIPTION OF THE PREFERRED EMBODIMENTS

Figure 1:
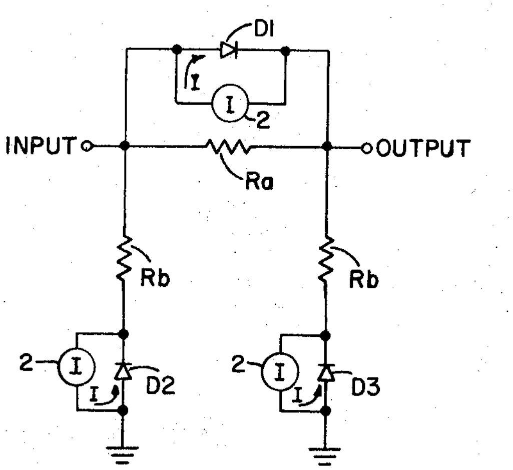
FIG. 1 is a schematic diagram of one embodiment of the invention.

Referring to FIG. 1, the basic idea is to control the variable resistance of PIN diodes D1, D2, and D3, such that the impedance at the input and output terminals is 50 ohms, the desired range of attenuation 0 to 10 db, the signal a negative pulse at a low duty cycle ((10 ns. wide at 10 mHz. PRF). In this case R*a* and R*b* would be chosen as 71 ohms and 96 ohms respectively, standard values for a 10 db, 50 ohm pad. When a pulse is applied at the input terminal, each of diodes D1, D2, and D3 will be biased either on, off, or at some intermediate point (as determined by a current source 2 connected in parallel with the respective diode for biasing the diode "on" or "off"). Accordingly, when diode D1 is biased "off" and diodes D2 and D3 are heavily biased "on," the network will be a matched 10 db attenuator. When D1 is heavily biased "on" and diodes D2 and D3 are biased "off," a short circuit between input and output will exist and the attenuation will be 0 db. Finally, if all the diodes, D1, D2, and D3, are biased partially "on," then the series leg will have resistance less than R*a* while the shunt legs will have resistances greater than R*b*. This results in an attenuation intermediate between 0 and 10 db. By adjusting the relative bias currents in the series and shunt diodes, the corresponding series and shunt resistances can be made such that this intermediate attenuation is obtained while still maintaining constant impedance at the input and the output.

Figure 2:
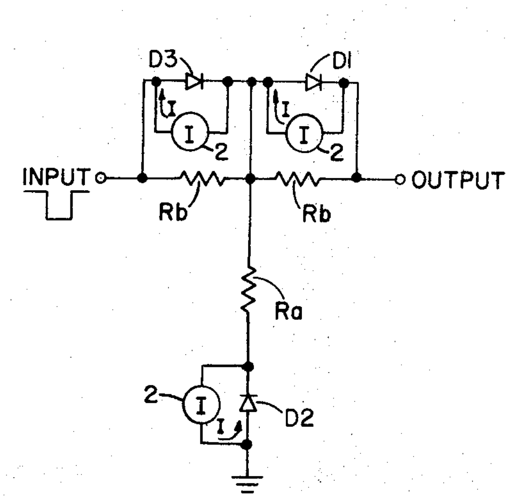
FIGS. 2, 3, 4, and 5 are schematic diagrams of other embodiments of the invention.

The operation of the T section attenuator shown in FIG. 2 is similar to the operation of the P*i* section shown in FIG. 1. Assuming that R*a* and R*b* have been chosen for a 10 db pad. When diodes D1 and D3 are biased "off" and diode D2 is biased "on" the pad will be a 10 db pad. When diodes D1 and D3 are biased "on" and diode D2 is biased "off," the pad will be a 0 db pad. When the diodes are biased at some point intermediate between "on" and "off," the pad will present a db between 0 and 10.

Figure 3:
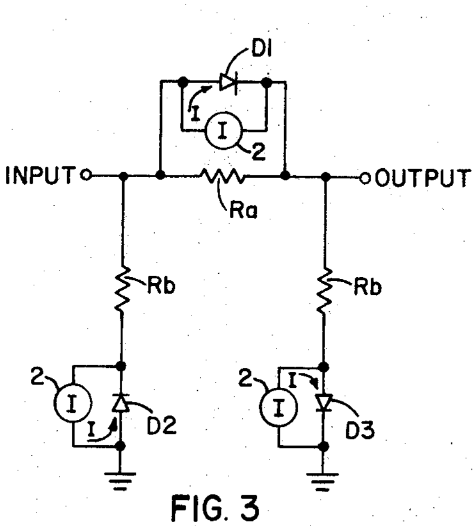

FIG. 3 differs from FIG. 1 by having D3 connected in the opposite direction. When D1 is biased "on," D2 and D3 will be biased "off" and vice versa.

Figure 4:
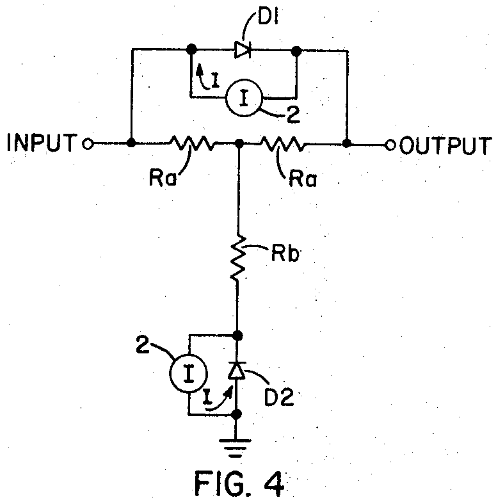

FIG. 4 presents yet a different embodiment of the present invention. Only one diode, D1, is used in the series leg. Diode D2 will be biased "on" when diode D1 is biased "off."

The limitations of the present invention may be described primarily in terms of the diode parameters. For example, even when a diode is biased "off" it still exhibits a finite junction capacity. Therefore neither the series or shunt arms can be perfect open circuits. Similarly, even when heavily forward biased, a diode still has a finite dynamic resistance and it cannot, therefore, be a perfect short circuit.

Figure 5:
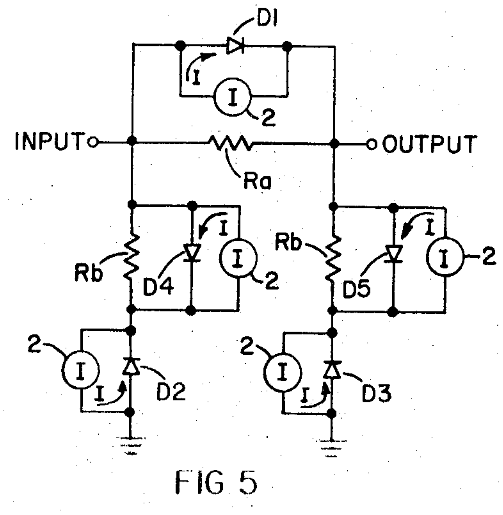

Also, a sudden pulse tends to change the resistance of the diodes. This tends to produce an undesired variation in the net attenuation. The opposite poling of the shunt diodes as shown in FIGS. 3 and 5 provides compensation for the tendency of the net attenuation to change during the passage of a signal pulse. In general it can be shown that this change will be significant only when the charge represented by the input pulse (current amplitude times pulse duration) is not small compared to either the biasing charge (bias current times duration of application) or the product of the bias current and the minority carrier lifetime whichever of the latter is smaller. Optimum operation is usually obtained when the duty cycle is low and the pulse duration is short compared to the minority carrier lifetime. Under forward bias conditions, both holes and electrons are injected into the intrinsic region of a PIN diode. The result of the presence of these carriers in the I region is to lower the dynamic resistance and increase the junction capacity. Under heavy forward bias conditions the diode becomes nearly a short circuit. A finite time characterized by "minority carrier lifetime" is required for these carriers to disappear by recombination. Consequently, when the current through the diode is reversed it will continue to exhibit a low impedance for some period of time.

While the invention has been described with reference to a preferred embodiment thereof, it will be apparent that various modifications and other embodiments thereof, will occur to those skilled in the art within the scope of the invention. Examples of various embodiments of the present invention are shown in FIGS. 2–5.

I claim:

1. An attenuator comprising: first, second, and third diodes; first, second, and third resistors; an input and an output terminal; current biasing means connected across each said first, second, and third diode; said first diode and said first resistor being connected in parallel between said input and said output terminals, the anode of said first diode being connected to said input terminal; said second diode and said second resistor being connected in series between said input and ground, the anode of said second diode being connected to ground; said third diode and said third resistor being connected in series between said output terminal and said ground, the anode of said third diode being connected to said ground.

2. An attenuator as set forth in claim 1 wherein said diodes are PIN diodes.

3. An attenuator as set forth in claim 1 further comprising a fourth and fifth diode, said fourth diode being connected in parallel with said second resistor, the anode of said fourth diode being connected to said input terminal; said fifth diode being connected in parallel with said third resistor, the anode of said fifth diode being connected to said output terminal; said first, second, third, fourth, and fifth diodes being PIN diodes.

4. An attenuator comprising: first, second, and third diodes; first, second, and third resistors; an input and an output terminal; current biasing means connected across each said first, second, and third diode; said first diode and said first resistor being connected in parallel and connected in series with the parallel combination of said third diode and said third resistor, the cathode of said first diode being connected to said output terminal and the anode of said third diode being connected to said input terminal; said second diode and said second resistor being connected in series between said input terminal and ground, the anode of said second diode being connected to ground and said second resistor being connected to said input terminal by way of said third resistor.

5. An attenuator as set forth in claim 4 wherein said diodes are PIN diodes.

6. An attenuator comprising: first, second and third diodes; first, second and third resistors; an input and an output terminal; current biasing means connected acros each said first, second and third diode; said first diode and said first resistor being connected in parallel between said input and said output terminals, the anode of said first diode being connected to said input terminal; said second diode and said second resistor being connected in series between said input terminal and ground, the anode of said second diode being connected to ground; said third diode and said third resistor being connected in series between said input terminal and said ground, the cathode of said third diode being connected to said ground.

7. An attenuator as set forth in claim 6 wherein said diodes are PIN diodes.

8. An attenuator comprising; a first and a second diode; first, second, and third resistors; an input and an output terminal; current biasing means connected across each said first and second diode; said first diode being connected in parallel with the series connection of said first resistor and said third resistor, the cathode of said first diode being connected to said output terminal and the anode of said first diode being connected to said input terminal; said second diode and said second resistor being connected in series between said input terminal and ground, the anode of said second diode being connected to ground and said second resistor being connected to said input terminal by way of said third resistor; said diodes being PIN diodes.

References Cited

UNITED STATES PATENTS

| | | | |
|---|---|---|---|
| 1,892,215 | 12/1932 | Mathieu | 333—81 X |
| 2,104,336 | 1/1938 | Tuttle. | |
| 2,246,293 | 6/1941 | Collard | 333—81 |
| 2,876,642 | 3/1959 | Scorgie | 307—237 X |
| 3,054,068 | 9/1962 | De Jong | 307—237 X |
| 3,153,189 | 10/1964 | Sweeney | 333—81 X |

PAUL L. GENSLER, Primary Examiner

U.S. Cl. X.R.

307—237; 323—74